United States Patent
Chang et al.

(10) Patent No.: US 8,522,171 B1
(45) Date of Patent: Aug. 27, 2013

(54) METHOD FOR CHECKING DIE SEAL RING ON LAYOUT AND COMPUTER SYSTEM

(75) Inventors: Jui-Yun Chang, Miaoli County (TW); Jian-Cheng Chen, New Taipei (TW); I-Jen Kao, Hsinchu (TW); Chih-Wei Hsu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/488,147

(22) Filed: Jun. 4, 2012

(51) Int. Cl.
*G06F 17/50* (2006.01)
(52) U.S. Cl.
USPC .............................................. 716/51; 716/52
(58) Field of Classification Search
USPC ..................................... 716/50–56
See application file for complete search history.

(56) References Cited

U.S. PATENT DOCUMENTS

| | | | |
|---|---|---|---|
| 7,653,892 B1 * | 1/2010 | Gennari et al. | 716/50 |
| 2005/0095509 A1 * | 5/2005 | Zhang et al. | 430/5 |
| 2006/0088772 A1 * | 4/2006 | Zhang | 430/5 |

* cited by examiner

*Primary Examiner* — Binh Tat
(74) *Attorney, Agent, or Firm* — J.C. Patents

(57) ABSTRACT

The invention is directed to a method for checking a die seal ring on a layout. The method comprises steps of receiving a digital database of a layout corresponding to at least a device with a text information corresponding to the layout. Tape-out information corresponding to the layout is received. A checking process is performed according to the digital database of the layout and the tape-out information and, meanwhile, a mask design procedure for designing a mask pattern corresponding to the layout is performed by using the digital database of the layout, the text information and the tape-out information. A result of the checking process is recorded in an inspection table corresponding to the layout.

8 Claims, 3 Drawing Sheets

METHOD FOR CHECKING DIE SEAL RING ON LAYOUT AND COMPUTER SYSTEM

BACKGROUND OF THE INVENTION

1. Field of Invention

The present invention relates to a method for designing a mask pattern and a computer system. More particularly, the present invention relates to a method for checking a die seal ring on a layout and a computer system.

2. Description of Related Art

Currently, when an electronic product is ready for being produced, the layout of the product is transferred to the mask manufacturer for designing a mask pattern according to the layout and further manufacturing the mask with the mask pattern thereon.

In the conventional mask design procedure, the mask pattern is designed according to the layout information provided by the product owner and the customer demand information inputted by the customer contact window. After the design of the mask pattern is finished, the mask pattern is inspected by the inspection operator for checking whether there is error design in the mask pattern. However, both of the customer demand information inputted by the customer contact window and the inspection of the mask pattern by the inspection operator lead to man-made mistake. Therefore, the error related to the die seal ring on the designed mask pattern easily happen and is not yet detected even until the mask with the mask pattern thereon is manufactured.

SUMMARY OF THE INVENTION

The present invention provides a method for checking a die seal ring on a layout capable of improving the customer satisfaction and decreasing the workload of the inspection operator.

The present invention further provides a computer system capable of decreasing the tape-out cycle time and the mask design error.

The present invention is to provide a method for checking a die seal ring on a layout. The method comprises steps of receiving a digital database of a layout corresponding to at least a device with a text information corresponding to the layout. Tape-out information corresponding to the layout is received. A checking process is performed according to the digital database of the layout and the tape-out information and, meanwhile, a mask design procedure for designing a mask pattern corresponding to the layout is performed by using the digital database of the layout, the text information and the tape-out information. A result of the checking process is recorded in an inspection table corresponding to the layout.

According to one embodiment of the present invention, the text information explains the digital database of the layout.

According to one embodiment of the present invention, the tape-out information reveals at least a customer demand for the mask pattern corresponding to the layout which is necessary for designing the mask pattern in the mask design procedure.

According to one embodiment of the present invention, the result of the checking process includes a double-die-seal-ring check result, a missing-die-seal-ring check result or an OK die-seal-ring check result.

According to one embodiment of the present invention, after the step of performing the checking process, the method further comprises issuing an alarm indicating the result of the checking process to an individual responsible for the tape-out information when the result of the checking process is the double-die-seal-ring check result or the missing-die-seal-ring check result.

According to one embodiment of the present invention, the step of performing the checking process further comprises performing an analyzing process on the digital database of the layout by referring to the text information to obtain a die seal ring information corresponding to the device and checking the die seal ring information corresponding to the device with the tape-out information.

The present invention also provides a computer system. The computer system comprises a receiver, a storage media and a processor. The receiver receives a digital database of a layout corresponding to at least a device with a text information corresponding to the layout and receives a tape-out information corresponding to the layout. The storage media stores a computer readable and writable program. The processor executes a plurality of instructions of the computer readable and writable program. The instructions comprises performing a checking process according to the digital database of the layout and the tape-out information while the digital database of the layout, the text information and the tape-out information are used in a mask design procedure for designing a mask pattern corresponding to the layout and recording a result of the checking process in an inspection table corresponding to the layout.

According to one embodiment of the present invention, the text information explains the digital database of the layout.

According to one embodiment of the present invention, the tape-out information reveals at least a customer demand for the mask pattern corresponding to the layout which is necessary for designing the mask pattern in the mask design procedure.

According to one embodiment of the present invention, the result of the checking process includes a double-die-seal-ring check result, a missing-die-seal-ring check result or an OK die-seal-ring check result.

According to one embodiment of the present invention, the computer system further comprises a transmitter for transmitting an alarm indicating the result of the checking process to an individual responsible for the tape-out information when the result of the checking process is the double-die-seal-ring check result or the missing-die-seal-ring check result.

According to one embodiment of the present invention, the instruction of performing the checking process comprises performing an analyzing process on the digital database of the layout by referring to the text information to obtain a die seal ring information corresponding to the device and checking the die seal ring information corresponding to the device with the tape-out information.

In the present invention, since the checking process is automatically performed at the time the mask design procedure is performed, the result of the checking process is automatically fed into the inspection table before the mask pattern enters the inspection stage and the result of the checking process clearly shows whether there is die-seal-ring error in the mask pattern. Therefore, the die-seal-ring error such as the double-die-seal-ring error or the missing-die-seal-ring error can be accurately predicted in advanced and the workload of the inspection operator can be decreased and the customer satisfaction can be improved. Further, the man-made mistake can be decreased, and the tape-out cycle time and mask error can be decreased as well.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
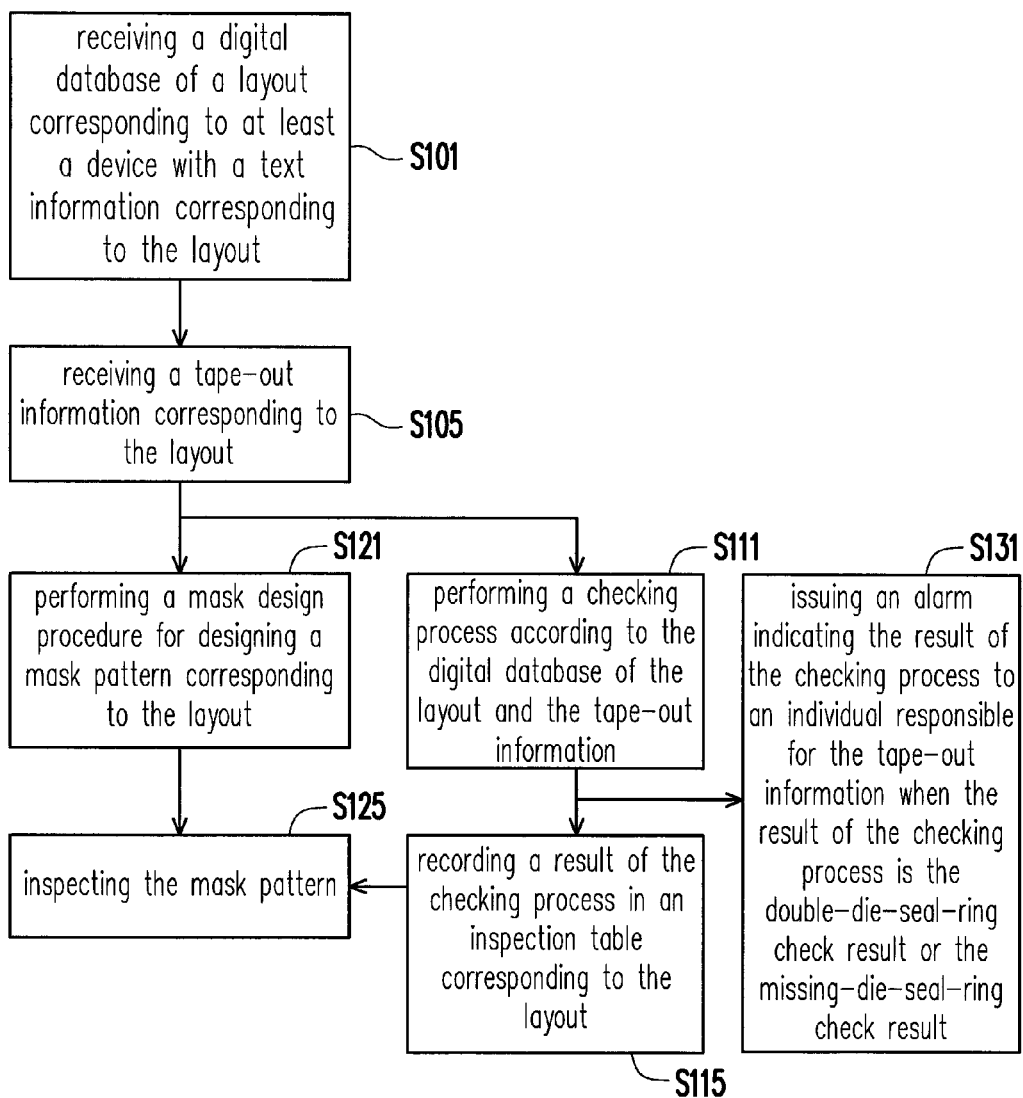
FIG. 1 is a flow chart schematically illustrating a method for checking a die seal ring on a layout according to one embodiment of the present invention.
Figure 2:
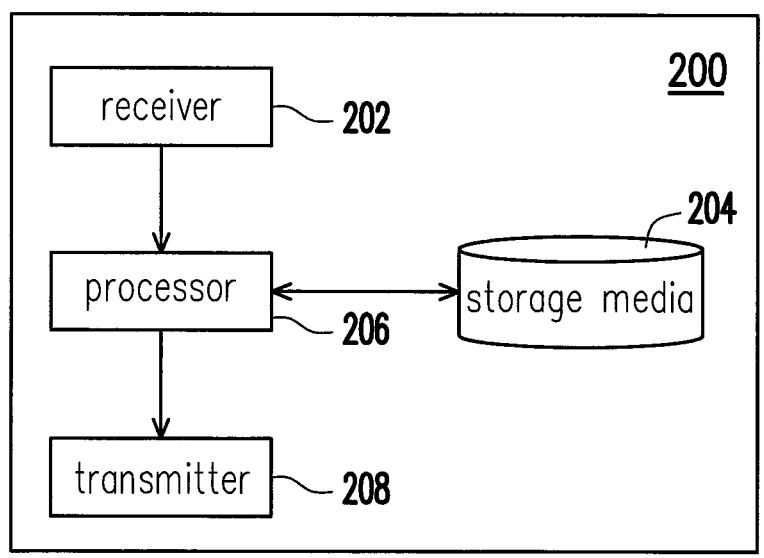
FIG. 2 is a schematic diagram illustrating a computer system according to one embodiment of the present invention.

FIG. 1 is a flow chart schematically illustrating a method for checking a die seal ring on a layout according to one embodiment of the present invention. FIG. 2 is a schematic diagram illustrating a computer system according to one embodiment of the present invention. As shown in FIG. 1 and FIG. 2, the computer system 200 of the present embodiment comprises a receiver 202, a storage media 204, a processor 206 and a transmitter 208. The receiver 202 can be, for example but not limited to, a user interface for the user to input information or data into the computer system. The computer system can be, for example but not limited to, a personal computer, a server such as a personal server, a cloud server, an internet server or the electronic device capable of handling the logic calculations.

As shown in FIG. 1 and FIG. 2, the receiver 202 receives a digital database of a layout with a text information corresponding to the layout (the step S101) and receives tape-out information corresponding to the layout (the step S105). It should be noticed that the layout is corresponding to at least a device. Moreover, noticeably, in FIG. 1, the step of receiving the digital database with the text information is precedent to the step of receiving the tape-out information. However, the order of the steps does not limit the scope of the present invention. In other words, the step S101 and S105 can be performed simultaneously.

Furthermore, the text information corresponding to the layout explains the digital database of the layout. That is, the digital database includes batches of digital 0 and digital 1 to represent the layout corresponding to the at least device and, by further analyzing the digital database with referring to the text information corresponding to the layout, a full picture of the layout corresponding to the at least one device is shown. More specifically, the digital database of the layout and the text information corresponding to the layout are provided by the customer to the mask manufacturer for manufacturing a mask corresponding to the layout and the full picture of the layout reveals the details of the layout such as whether the layout includes the die seal ring pattern and what kind of the die seal ring pattern is.

In addition, the tape-out information reveals at least a customer demand for the mask pattern corresponding to the layout which is necessary for designing the mask pattern in the mask design procedure. In one embodiment, the tape-out information is the reminder for designing the mask pattern and is provided by the individual who can be the customer contact window and is familiar with the customer demands. Furthermore, the tape-out information can, for example, include whether the mask manufacturer needs to add the die seal ring pattern in the mask pattern corresponding to the layout.

In the step S111, a checking process is performed according to the digital database of the layout and the tape-out information and, meanwhile, a mask design procedure for designing a mask pattern corresponding to the layout is performed by using the digital database of the layout, the text information and the tape-out information (the step S121). That is, at the time the mask design procedure is performed according to the digital database and the text information which are provided by the customer and the tape-out information inputted by the individual who is the customer contact window, the checking process is performed to check the die seal ring in the layout simultaneously. The mask design procedure includes integrating information, framing, adding die seal ring, performing optical proximity simulation, adding test key, translating information or a combination thereof.

Figure 3:
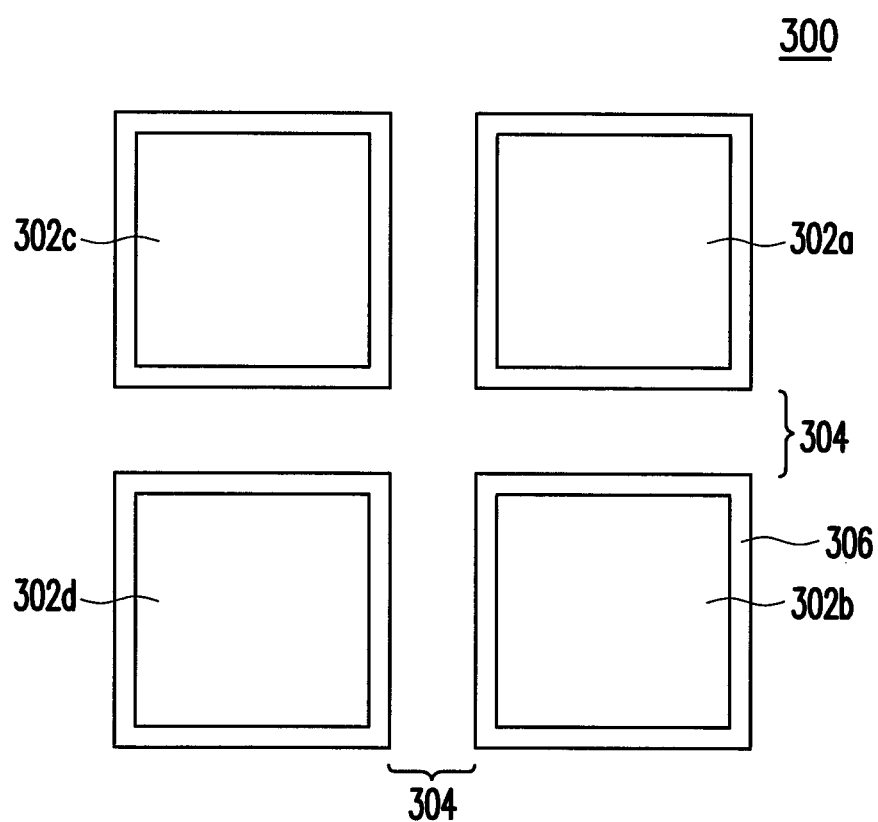
FIG. 3 is a schematic diagram showing an exemplar of die seal ring pattern on a wafer.

FIG. 3 is a schematic diagram showing an exemplar of die seal ring pattern on a wafer. As shown in FIG. 3, there are a plurality of dies including 302a, 302b, 302c and 302d on a wafer 300 and the dies are separated from each other by a scribe line 304 therebetween. Moreover, the devices such as CMOS, resistor, capacitor and memory cell (not shown) are disposed within a die and each of the dies is enclosed by a die seal ring 306 on the peripheral region of the die. The die seal ring 306 can protect the die from being damaged when the wafer 300 is cut into dies. In the exemplar shown in FIG. 3, the shape of the single whole die seal ring enclosing single die is a rectangle and the pattern of the die seal ring is in a form of solid line. However, the shape of the single whole die seal ring and the pattern of the die seal ring do not limit the scope of the present invention. That is, the shape of the single whole die seal ring can be any shapes such as a trapezoid, a rectangle with rounded corner, or a polygon and the pattern of the die seal ring can be in form of, for example, dotted line.

Figure 1A:
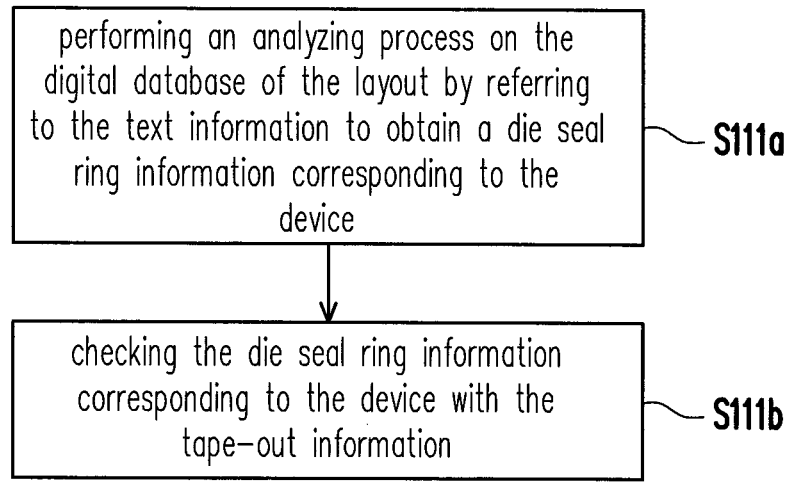
FIG. 1A is a flow chart schematically illustrating the checking process in the method for checking the die seal ring on the layout according to one embodiment of the present invention.

FIG. 1A is a flow chart schematically illustrating the checking process in the method for checking the die seal ring on the layout according to one embodiment of the present invention. As shown in FIG. 1A, in one embodiment, the checking process includes performing an analyzing process on the digital database of the layout by referring to the text information to obtain a die seal ring information corresponding to the device (step S111a) and checking the die seal ring information corresponding to the device with the tape-out information (step S111b).

It should be noticed that, in the step S111a, the digital database of the layout is analyzed by referring to the text information to extract the die seal ring information corresponding to the device from the digital database. The extracted die seal ring information includes whether the die seal ring exists in the layout, the shape of the die seal ring or the measurement of the die seal ring. Thereafter, in the step S111b, the die seal ring information is checked with the tape-out information to determine whether there is any die seal ring error in the mask pattern formed by referring to the digital database, the text information and the tape-out information. It should be noticed that the result of the checking process includes a double-die-seal-ring check result, a missing-die-seal-ring check result or an OK die-seal-ring check result. In one embodiment, when the extracted die seal ring information reveals that the digital database already includes the die seal ring pattern and the tape-out information reveals that the mask manufacturer is required to add the die seal ring pattern in the mask pattern, the result of the checking process shows there is a double-die-seal-ring error in the mask pattern designed by performing the mask design procedure (i.e. the double-die-seal-ring check result). In another embodiment, when the extracted die seal ring information reveals that the digital database does not include any die seal ring pattern and the tape-out information reveals that it is not necessary for the mask manufacturer to add the die seal ring pattern in the mask pattern, the result of the checking process shows there is a missing-die-seal-ring error in the mask pattern designed by performing the mask design procedure (i.e. the missing-die-seal-ring check result). In the other embodiment, when either the extracted die seal ring information reveals that the digital database includes the die seal ring pattern or the tape-out information reveals that the mask manufacturer needs to add the die seal ring pattern in the mask pattern, the result of the checking process shows there is no die-seal-ring error in the mask pattern designed by performing the mask design procedure (i.e. the OK die-seal-ring check result).

As shown in FIG. 1, in the step S115, the result of checking process is recorded in an inspection table corresponding to the layout in the inspection stage (step S125) after the mask design procedure (step S121). It should be noticed that the step of inspecting the mask pattern from the mask design procedure (step S125) and the step of recording the result of the checking process in the inspection table (step S115) are not necessary happen simultaneously and the present invention is not limited thereto. In one embodiment, the checking process is finished before the mask design procedure is finished so that the result of the checking process is fed into the inspection table (step S115) before the mask pattern corresponding to the layout enters the inspection stage (step S125).

Furthermore, in another embodiment, after the step of performing the checking process, when the result of the checking process shows there is a die-seal-ring error in the mask pattern which is the double-die-seal-ring check result or the missing-die-seal-ring check result, an alarm indicating the result of the checking process is issued to an individual responsible for the tape-out information (step S131). In one embodiment, the transmitter 208 of the computer system 200 transmits the alarm in a form of email or short message to the individual who can be the customer contact window and is responsible for inputting the tape-out information.

In the present invention, some of the aforementioned steps in the method for checking the die seal ring on the design layout can be implemented by the processor 206 of the computer system 200 executing the instructions of a computer readable and writable program stored in the storage media 204 of the computer system 200. In other words, the instructions of the computer readable and writable program include the steps for performing the checking process, recording the result of the checking process in the inspection table and issuing the alarm to the individual responsible for the tape-out information (steps S111, S115, S131, S111a and S111b) and the steps mentioned above is detailed in the previous embodiment and are not described herein.

In the present invention, since the checking process is automatically performed at the time the mask design procedure is performed, the result of the checking process is automatically fed into the inspection table before the mask pattern enters the inspection stage and the result of the checking process clearly shows whether there is die-seal-ring error in the mask pattern. Therefore, the die-seal-ring error such as the double-die-seal-ring error or the missing-die-seal-ring error can be accurately predicted in advanced and the workload of the inspection operator can be decreased and the customer satisfaction can be improved. Further, the man-made mistake can be decreased, and the tape-out cycle time and mask error can be decreased as well.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for checking a die seal ring on a layout, comprising executing, by a computer, steps of:
   receiving a digital database of a layout corresponding to at least a device with a text information corresponding to the layout and receiving a tape-out information corresponding to the layout;
   after receiving the tape-out information corresponding to the layout, performing a checking process according to the digital database of the layout and the tape-out information while performing a mask design procedure for designing a mask pattern corresponding to the layout by using the digital database of the layout, the text information and the tape-out information; and
   recording a result of the checking process in an inspection table corresponding to the layout, wherein the result of the checking process includes a double-die-seal-ring check result, a missing-die-seal-ring check result or an OK die-seal-ring check result;
   after the step of performing the checking process, further comprising: when the result of the checking process is the double-die-seal-ring check result or the missing-die-seal-ring check result, issuing an alarm indicating the result of the checking process to an individual responsible for the tape-out information.

2. The method of claim 1, wherein the text information explains the digital database of the layout.

3. The method of claim 1, wherein the tape-out information reveals at least a customer demand for the mask pattern corresponding to the layout which is necessary for designing the mask pattern in the mask design procedure.

4. The method of claim 1, the step of performing the checking process further comprises:
   performing an analyzing process on the digital database of the layout by referring to the text information to obtain a die seal ring information corresponding to the device; and
   checking the die seal ring information corresponding to the device with the tape-out information.

5. A computer system, comprising:
   a receiver for receiving a digital database of a layout corresponding to at least a device with a text information corresponding to the layout and receiving a tape-out information corresponding to the layout;
   a storage media for storing a computer readable and writable program;
   a processor for executing a plurality of instructions of the computer readable and writable program, wherein the instructions comprises:
   after the receiver receives the tape-out information corresponding to the layout, performing a checking process according to the digital database of the layout and the tape-out information while the digital database of the layout, the text information and the tape-out information are used in a mask design procedure for designing a mask pattern corresponding to the layout; and recording a result of the checking process in an inspection table corresponding to the layout, wherein the result of the checking process includes a double-die-seal-ring check result, a missing-die-seal-ring check result or an OK die-seal-ring check result;

a transmitter for transmitting an alarm indicating the result of the checking process to an individual responsible for the tape-out information when the result of the checking process is the double-die-seal-ring check result or the missing-die-seal-ring check result.

6. The computer system of claim 5, wherein the text information explains the digital database of the layout.

7. The computer system of claim 5, wherein the tape-out information reveals at least a customer demand for the mask pattern corresponding to the layout which is necessary for designing the mask pattern in the mask design procedure.

8. The computer system of claim 5, wherein the instruction of performing the checking process comprises:

performing an analyzing process on the digital database of the layout by referring to the text information to obtain a die seal ring information corresponding to the device; and checking the die seal ring information corresponding to the device with the tape-out information.

* * * * *